United States Patent
Ting et al.

(10) Patent No.: US 10,062,735 B2
(45) Date of Patent: Aug. 28, 2018

(54) INNOVATIVE APPROACH OF 4F² DRIVER FORMATION FOR HIGH-DENSITY RRAM AND MRAM

(71) Applicant: Taiwan Semiconductor Manufacturing Co., Ltd., Hsin-Chu (TW)

(72) Inventors: Yu-Wei Ting, Taipei (TW); Chi-Wen Liu, Hsinchu (TW); Chun-Yang Tsai, Hsinchu (TW); Kuo-Ching Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 25 days.

(21) Appl. No.: 15/347,255

(22) Filed: Nov. 9, 2016

(65) Prior Publication Data
US 2017/0062525 A1   Mar. 2, 2017

Related U.S. Application Data

(63) Continuation of application No. 14/450,809, filed on Aug. 4, 2014, now Pat. No. 9,520,446, which is a (Continued)

(51) Int. Cl.
*H01L 29/66* (2006.01)
*H01L 27/24* (2006.01)
(Continued)

(52) U.S. Cl.
CPC ........ *H01L 27/2454* (2013.01); *H01L 27/228* (2013.01); *H01L 27/2463* (2013.01); *H01L 29/4236* (2013.01); *H01L 29/7827* (2013.01)

(58) Field of Classification Search
CPC ........... H01L 29/7827; H01L 29/66666; H01L 29/1037
See application file for complete search history.

(56) References Cited

U.S. PATENT DOCUMENTS

| 6,165,864 A | 12/2000 | Shen et al. |
| 2005/0001257 A1 | 1/2005 | Schloesser et al. |
| (Continued) | | |

FOREIGN PATENT DOCUMENTS

| DE | 102007054641 A1 | 5/2009 |
| JP | 2012080100 A | 4/2012 |
| TW | I253171 B | 4/2006 |

OTHER PUBLICATIONS

U.S. Appl. No. 13/674,204, filed Nov. 12, 2012.
(Continued)

*Primary Examiner* — Mohsen Ahmadi
*Assistant Examiner* — Wasiul Haider
(74) *Attorney, Agent, or Firm* — Eschweiler & Potashnik, LLC

(57) ABSTRACT

Some embodiments of the present disclosure relate to an integrated chip having a vertical transistor device. The integrated chip may have a semiconductor body with a trench extending along first sides of a source region, a channel region over the source region, and a drain region over the channel region. A gate electrode is arranged along a first sidewall of the trench, and a metal contact is arranged on the drain region. An isolation dielectric material is disposed within the trench. The isolation dielectric material is vertically over a top surface of the gate electrode and is laterally adjacent to the gate electrode.

20 Claims, 12 Drawing Sheets

Related U.S. Application Data continuation-in-part of application No. 13/674,204, filed on Nov. 12, 2012, now Pat. No. 9,178,040.

(51) Int. Cl.
   *H01L 27/22* (2006.01)
   *H01L 29/423* (2006.01)
   *H01L 29/78* (2006.01)

(56) References Cited

U.S. PATENT DOCUMENTS

| | | |
|---|---|---|
| 2005/0083724 A1 | 4/2005 | Manger et al. |
| 2005/0201187 A1* | 9/2005 | Hofmann .............. H01L 27/28 |
| | | 365/232 |
| 2006/0273298 A1* | 12/2006 | Petti .................... H01L 27/2481 |
| | | 257/5 |
| 2008/0049486 A1 | 2/2008 | Gruening-von Schwerin |
| 2008/0203469 A1 | 8/2008 | Gruening-von Schwerin |
| 2010/0059837 A1 | 3/2010 | Kim et al. |
| 2010/0232200 A1 | 9/2010 | Shepard |
| 2010/0237397 A1 | 9/2010 | Uchiyama |
| 2011/0188288 A1 | 8/2011 | Minami |
| 2011/0254067 A1 | 10/2011 | Abbott et al. |
| 2012/0040528 A1 | 2/2012 | Kim et al. |
| 2012/0080725 A1 | 4/2012 | Manes et al. |
| 2012/0146223 A1 | 6/2012 | Zhao et al. |
| 2012/0256242 A1 | 10/2012 | Chang et al. |
| 2012/0273872 A1 | 11/2012 | Lim et al. |
| 2013/0062679 A1 | 3/2013 | Manabe |
| 2013/0313511 A1 | 11/2013 | Kim et al. |

OTHER PUBLICATIONS

Non-Final Office Action dated Jan. 22, 2014 for U.S. Appl. No. 13/674,204.
Final Office Action dated Jul. 18, 2014 for U.S. Appl. No. 13/674,204.
Notice of Allowance dated Aug. 28, 2014 Korean Patent Application No. 10-2013-0012971.
Non Final OA dated Mar. 24, 2015 U.S. Appl. No. 13/674,204.
Notice of Allowance dated Jun. 22, 2015 for U.S. Appl. No. 13/674,204.
Non-Final Office Action dated Apr. 6, 2015 for U.S. Appl. No. 14/450,809.
Final Office Action dated Aug. 31, 2015 for U.S. Appl. No. 14/450,809.
Non-Final Office Action dated Mar. 10, 2016 for U.S. Appl. No. 14/450,809.
Notice of Allowance dated Aug. 9, 2016 for U.S. Appl. No. 14/450,809.

* cited by examiner

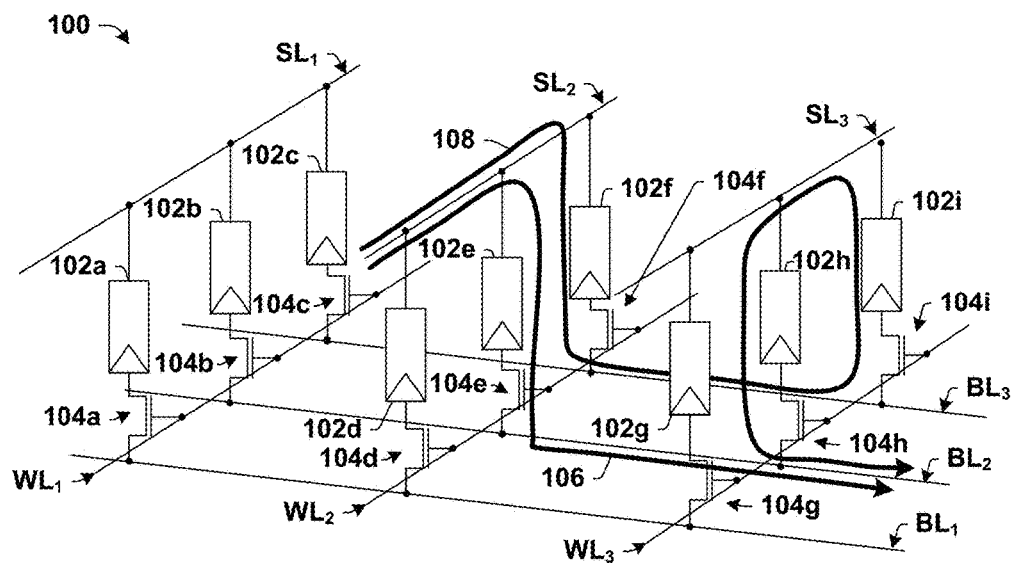
Fig. 1
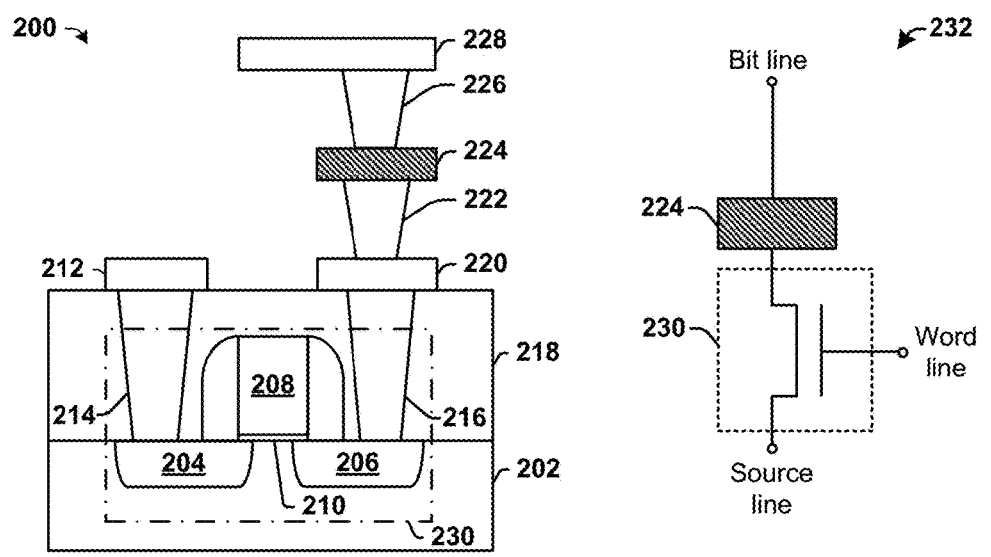
Fig. 2A     Fig. 2B

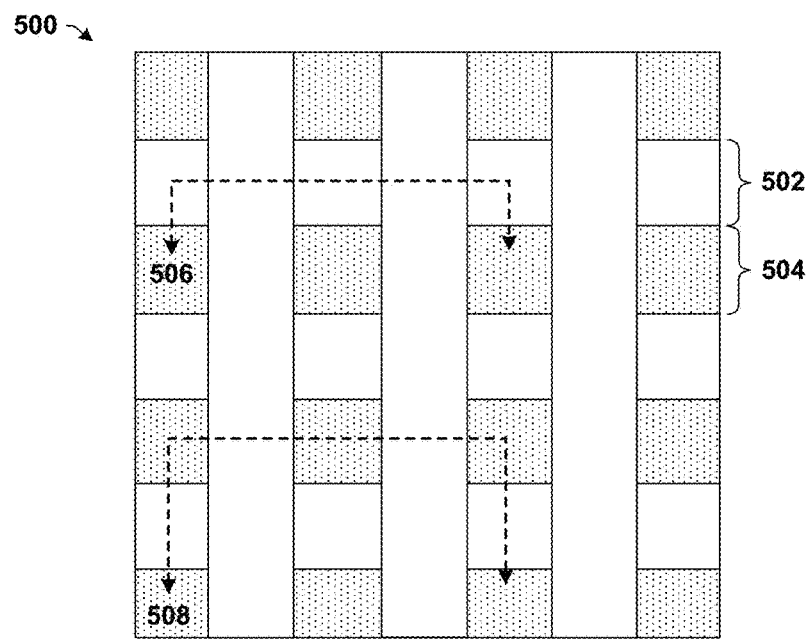
Fig. 5
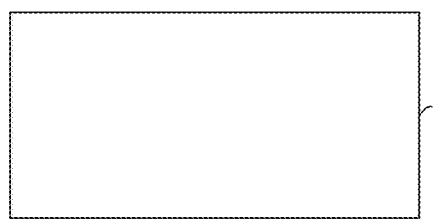 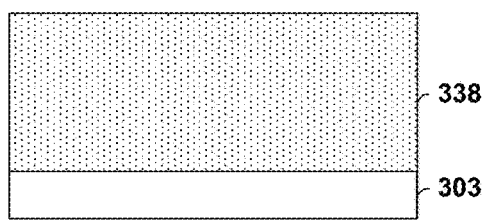
Fig. 6A  Fig. 6B

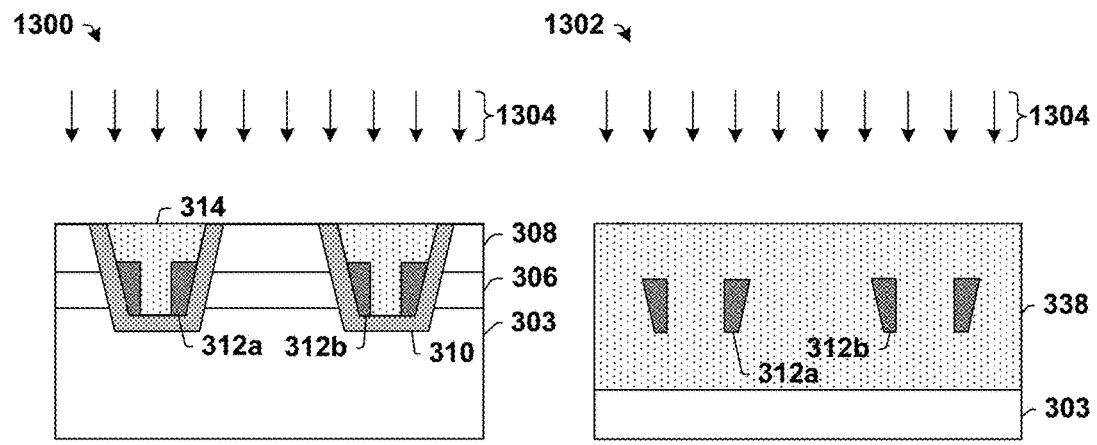
Fig. 13A  Fig. 13B
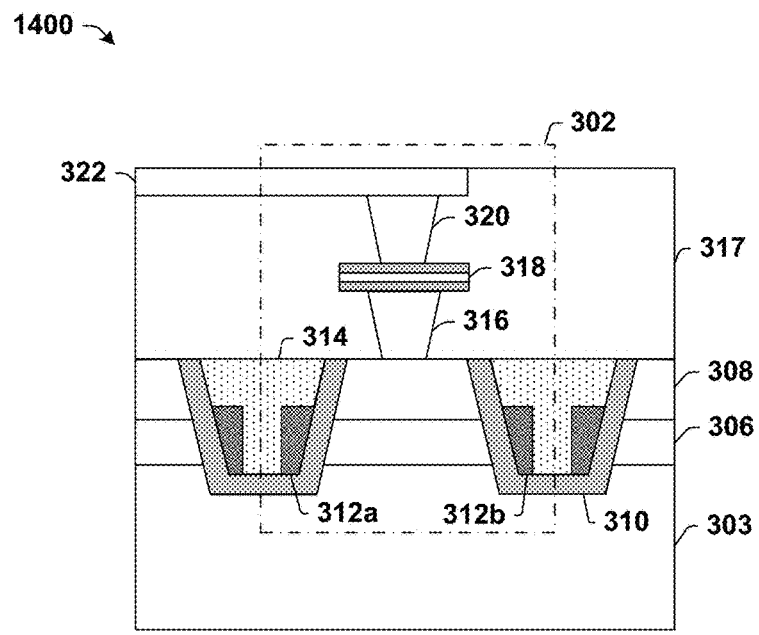
Fig. 14

INNOVATIVE APPROACH OF 4F² DRIVER FORMATION FOR HIGH-DENSITY RRAM AND MRAM

REFERENCE TO RELATED APPLICATIONS

This Application is a Continuation of U.S. application Ser. No. 14/450,809 filed on Aug. 4, 2014, which is a Continuation-in-Part of U.S. application Ser. No. 13/674,204 filed on Nov. 12, 2012 (now U.S. Pat. No. 9,178,040 issued on Nov. 3, 2015). The contents of both applications are hereby incorporated by references in their entirety.

BACKGROUND

Integrated chips use memory to store data and executable programs. As the functionality of an integrated chip increases, the need for more memory also increases, causing integrated chip designers and manufacturers to have to both increase the amount of available memory while decreasing the size and power consumption of an integrated chip. To reach this goal, the size of memory cell components has been aggressively shrunk over the past few decades.

The aggressive shrinkage of memory cells has benefited from the highly repeatable pattern of memory arrays. For example, the repeatable pattern used in memory arrays has allowed for lithography to be tuned to improve the lithographic resolution of memory cells over that of other logic circuits. However, as physical dimensions continue to shrink, the physical limits of elements within the memory cell are beginning to limit the size of memory cells.

BRIEF DESCRIPTION OF THE DRAWINGS

FIG. 1 is a block diagram of a memory array illustrating a sneak path problem within the memory array.

FIG. 2A shows a cross-sectional view of a selection transistor that mitigates the sneak path problem in a memory array.

FIG. 2B shows a schematic diagram of a selection transistor in a memory array.

FIG. 5 illustrates a top view of a memory array having one or more disclosed selection transistors.

FIGS. 6A-14 are cross-sectional views of some embodiments of an example semiconductor body upon which a method of forming a selection transistor is performed.

DETAILED DESCRIPTION

Figure 3A:
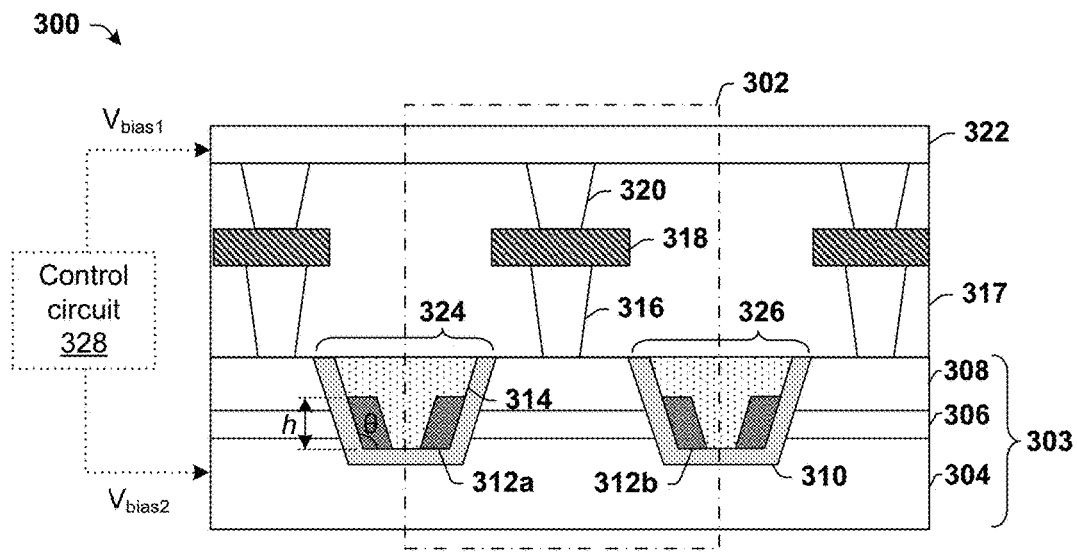
FIG. 3A illustrates a cross-sectional view of some embodiments of a disclosed selection transistor.

One or more implementations of the present disclosure will now be described with reference to the attached drawings, wherein like reference numerals are used to refer to like elements throughout. The drawings are not necessarily drawn to scale.

FIG. 1 illustrates a memory array 100 comprising a plurality of memory cells 102 configured to store data. Respective memory cells 102 are coupled between a bit line $BL_n$ and a source line $SL_n$. A selection transistor 104 is associated with each memory cell 102. The selection transistor 104 may be located between the bitline $BL_n$ and the memory cell 102. The selection transistor 104 is configured to suppress sneak-path leakage (i.e., prevent current intended for a particular memory cell from passing through an adjacent memory cell) while providing enough driving current for memory cell operation. For example, when reading data from memory cell 102e, wordline $WL_2$ is activated to turn on selection transistor 104e, while adjacent wordlines, $WL_1$ and $WL_3$, are deactivated to turn off selection transistors 104a-104c and 104g-104i and guide a current along a first path 106.

A memory cell 102 within the memory array 100 can be accessed by activating a selection transistor 104 as well as a corresponding bit line $BL_n$ and source line $SL_n$ combination. For example, to write data to memory cell 102a, selection transistor 104a is turned on, while a first voltage potential is applied to bit line $BL_1$ and a second voltage potential is applied to source line $SL_1$.

FIG. 2A illustrates a cross-sectional view of a memory cell 200 comprising a conventional planar MOSFET selection transistor 230. The selection transistor 230 comprises a source 204 and a drain 206 comprised within a semiconductor body 202. A gate electrode 208 is located on the semiconductor body 202 at a position that is above the source 204 and drain 206. The gate electrode 208 is separated from the source 204 and drain 206 by a gate oxide layer 210 extending laterally over the surface of the semiconductor body 202. The source 204 is connected by way of a first metal contact 214 within a dielectric layer 218 to a source line 212 comprised within a first metallization layer. The drain 206 is connected by to a data storage element 224 by way of one or more metal contacts 216, 222 and/or metallization layers 220. The data storage element 224 is further connected to a bit line 228 comprised within an upper metallization layer by way of an additional metal contact 226. FIG. 2B illustrates a schematic diagram 232 showing the connection of a source line to the bit line in memory cell 200.

As the size of the planar MOSFET selection transistor 230 shrinks, the leakage current of the selection transistor increases. For example, in memory array 100 of FIG. 1, if the selection transistor 104h and 104i become too small, the leakage current of the selection transistors 104h and 104i can allow current to flow along a sneak path 108 resulting in a false reading of the memory cell. To prevent leakage current the size of a conventional selection transistor can be kept large, however such a large selection transistor limits the size of the memory cell 200 to at least a size of the planar MOSFET selection transistor 230.

Accordingly, the present disclosure relate to a memory array comprising memory cells having vertical gate-all-around (GAA) selection transistors. In some embodiments, the memory array comprises a source region disposed within an upper surface of a semiconductor body, and a semiconductor pillar comprising semiconductor material extending outward from the upper surface of the semiconductor body and having a channel region and an overlying drain region. A gate region vertically overlies the source region at a position laterally separated from sidewalls of the channel region by a gate dielectric layer. A first metal contact is configured to couple the drain region to a data storage element configured to store data. The vertical GAA selection transistors provide for good performance (e.g., good gate controllability and driving capabilities), while decreasing the size of the selection transistor relative to a planar MOSFET, so that the selection transistors do not negatively impact the size of the memory array.

FIG. 3A illustrates a cross-sectional view 300 of some embodiments of memory cell 302 comprising a disclosed selection transistor. In some embodiments, the memory cell 302 may comprise a resistive random access memory (RRAM) cell or a magnetic random access memory (MRAM) cell.

The memory cell 302 comprises a semiconductor body 303. The semiconductor body 303 has a source region 304 and a drain region 308. The drain region 308 is vertically separated from the source region 304 by a channel region 306. The source region 304 extends along a length of a memory array, comprising the memory cell 302, as a source line. The source region 304 comprises a first doping type (e.g., an n-type dopant), the channel region 306 comprises a second doping type different than the first doping type, and the drain region 308 comprises the first doping type. In some embodiments, the first doping type comprises an n-type doping, while in other embodiments the first doping type comprises a p-type doping.

A first trench 324 and a second trench 326 are located within a top surface of the semiconductor body 303. The first and second trenches, 324 and 326, form a raised semiconductor structure having the source region 304, the channel region 306, and the drain region 308 stacked along the height of the raised semiconductor structure. The first and second trenches, 324 and 326, extend from a top surface of the semiconductor body 303 to a first depth. In some embodiments, the first and second trenches, 324 and 326, comprise tapered sides that form an oblique angle θ with a bottom surface of the trenches such that the size of the first and second trenches, 324 and 326, is inversely proportional to the depth of the trench (i.e., the distance from the top surface of the semiconductor body 303).

A gate structure 312 has a gate electrode 312a abutting a first side of the raised semiconductor structure and a second gate electrode 312b butting an opposite, second side of the raised semiconductor structure. The first and second gate electrodes, 312a and 312b, are electrically connected to one another so that the first and second gate electrodes collectively control the flow of current between the source region 304 and the drain region 308. The first and second gate electrodes, 312a and 312b, have a height h that is greater than a height of the channel region 306. In various embodiments, the gate structure 312 may comprise a doped polysilicon material or a metal material (e.g., TiN). The double gate structure provides for a high driving current and junction breakdown voltage.

The first and second gate electrodes, 312a and 312b, are separated from the channel region 306 by a gate oxide layer 310 that extends vertically along a sidewall of the first and second trenches, 324 and 326. Since the first and second gate electrodes, 312a and 312b, extend vertically along the channel region 306 the surface area of the semiconductor body 303 consumed by the disclosed vertical MOSFET selection transistor is reduced in comparison to a conventional planar MOSFET selection transistor.

A first metal contact 316, disposed within an inter-level dielectric layer 317, is configured to electrically couple the drain region 308 of the selection transistor to a data storage element 318 configured to store data. In some embodiments, wherein the memory cell 302 comprises a RRAM cell, the data storage element 318 comprises a dielectric structure having a resistance that can be reversibly changed by application of an appropriate voltage across the dielectric structure. For example, the dielectric structure may be set to a high resistance corresponding to a first data state with the application of a first voltage and a low resistance corresponding to a second data state with the application of a second voltage, lower than the first voltage. In other embodiments, wherein the memory cell 302 comprises a MRAM cell, the data storage element 318 comprises a stacked magnetic storage element having a pinned (i.e., permanent) magnetic layer and a free magnetic layer separated by an insulating storage layer. The resistance of the stacked magnetic structure can be changed by varying a polarity of the insulating storage layer (e.g., by generating a magnetic field due to currents applied to write lines, which are not illustrated in FIG. 3A). For example, if a polarity of the insulating storage layer is aligned with the pinned magnetic layer, the polarity of the free magnetic layer is aligned with the pinned magnetic layer and the data storage element 318 has a first resistance value corresponding to a first data state. Alternatively, if a polarity of the insulating storage layer is misaligned with the pinned magnetic layer, the polarity of the free magnetic layer is misaligned with the pinned magnetic layer and the data storage element 318 has a second resistance value corresponding to a second data state.

A second metal contact 320 is configured to further connect the data storage element 318 to a metal layer comprising a bitline 322. In some embodiments, a control circuit 328 is in communication with and is configured to selectively bias the bitline 322 and the source region 304 to access (e.g., write data to or read data from) the data storage element 318. The control circuit 328 is configured to access the data storage element 318. For example, the control circuit 328 is configured to apply a first bias voltage $V_{bias1}$ to the data storage element 318 by way of bitline 322 and a second bias voltage $V_{bias2}$ to the data storage element 318 by way of the source region 304.

Figure 3B:
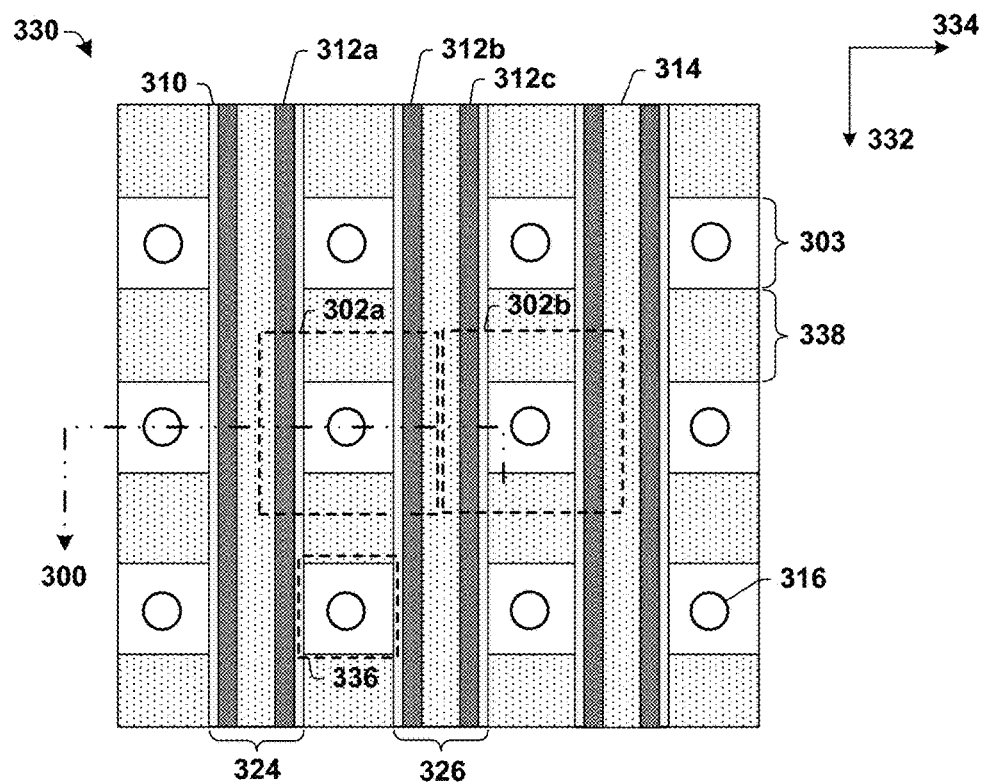
FIG. 3B illustrates a top view of some embodiments of memory array comprising a disclosed selection transistor.

FIG. 3B illustrates a top view of some embodiments of memory array 330 comprising a plurality of memory cells 302, respectively comprising a disclosed selection transistor.

The memory array 330 comprises a plurality of trenches 324, 326 extending along a first direction 332. The trenches 324, 326 are disposed within a surface of the semiconductor body 303. The trenches 324 and 326 are filled with a dielectric material 314 (e.g., a local isolation oxide) that provides isolation between adjacent selection transistors in a second direction 334, perpendicular to the first direction. The plurality of trenches 324, 326 further comprise multiple gate electrodes 312 extending along opposite sides of the trenches in the first direction 332. For example, trench 326 comprises a first gate electrode 312b extending along a first side of the trench and a second gate electrode 312c extending along an opposite, second side of the trench.

In the second direction 334, perpendicular to the first direction 332, the memory array 330 comprises a surface having alternating rows of semiconductor body 303 and a dielectric material 338. The rows of dielectric material 338 provide for isolation between adjacent selection transistors in the first direction 332. In some embodiments, the rows of dielectric material 338 may comprise a shallow trench isolation (STI).

The plurality of trenches 324, 326 pass through the semiconductor body 303 and the rows of dielectric material 338. Together, the rows of dielectric material 338, along with the plurality of trenches 324, 326 define a plurality of raised semiconductor structures 336 respectively having a drain region vertically separated from a source region by a channel region. The drain region is connected to a data storage element by way of a first metal contact 316 located on the raised semiconductor structure 336.

Respective memory cells 302 intersect adjacent trenches so that the selection transistor within a memory cell comprises a first gate structure in a first trench and a second gate electrode in a second trench. For example, memory cell 302a intersects the first and second trenches, 324 and 326, so that a selection transistor comprise a double gate vertical MOSFET transistor having a first gate structure 312a in a first trench 324 and a second gate structure 312b in a second trench 326.

Figure 4:
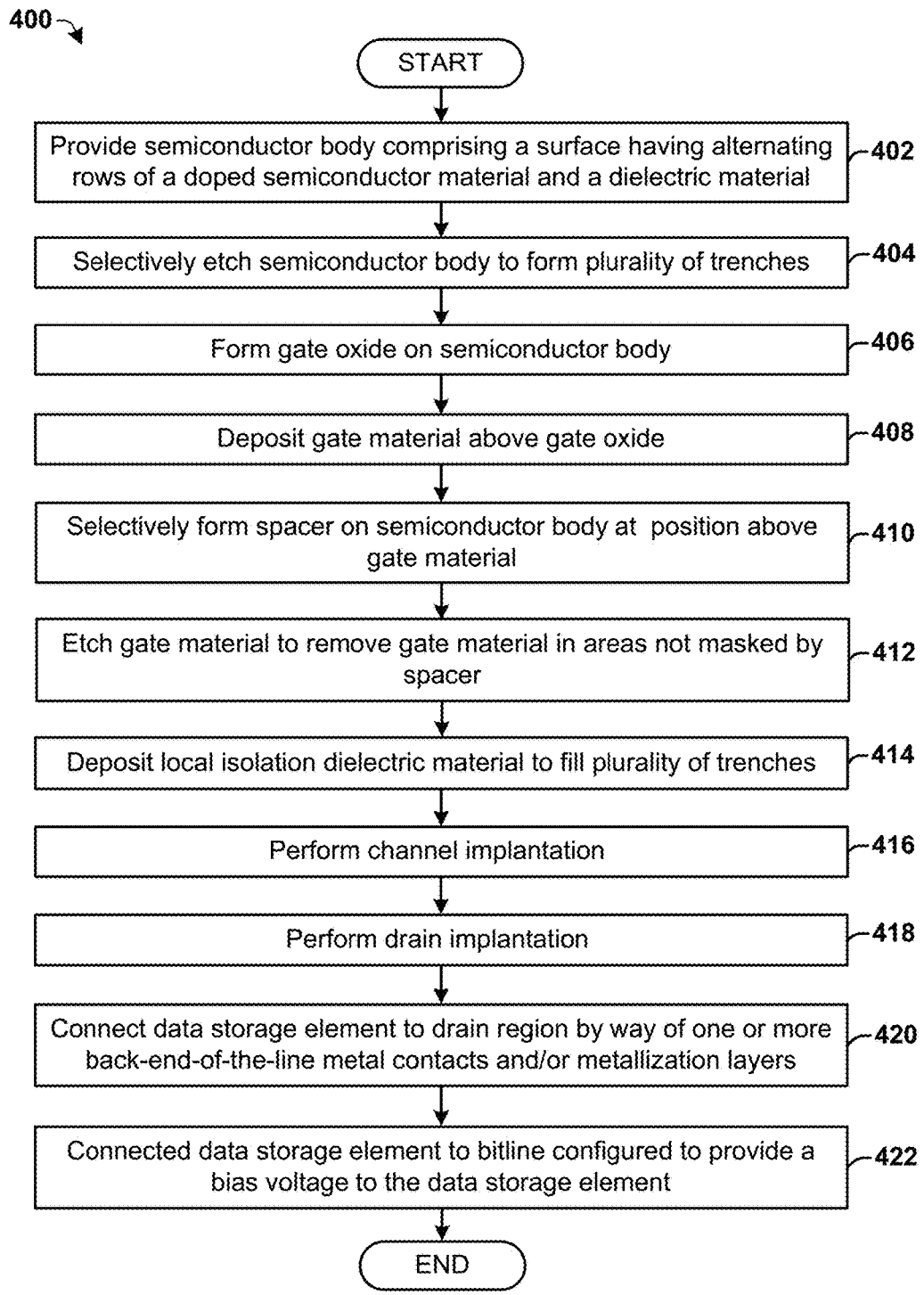
FIG. 4 is a flow diagram of an exemplary embodiment of a method for forming a selection transistor in a memory array.

FIG. 4 is a flow diagram of an exemplary embodiment of a method 400 for forming a disclosed vertical MOSFET selection transistor in a memory array.

While the disclosed methods (e.g., methods 400 and 1600) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a semiconductor body comprising a surface having alternating rows of a doped semiconductor material and a dielectric material is provided. In some embodiments, the semiconductor body comprises a silicon starting material, such as a single-crystal silicon with a <100> orientation, which has an n-type or p-type dopant concentration, along with STI trenches formed along rows of the substrate.

At 404, the semiconductor body is selectively etched to form a plurality of trenches within a top surface of the semiconductor body. In some embodiments, the semiconductor body is selectively masked by forming a first masking layer on a top surface the semiconductor body, which defines a location of the plurality of trenches. The substrate is then selectively etched in open areas of the first masking layer.

At 406, a gate oxide layer is formed on the semiconductor body. The gate oxide layer is conformally deposited onto the semiconductor body, so that the gate oxide layer is deposited on the bottom and sidewalls of the trenches.

At 408, a gate material is deposited on the semiconductor body at a position that is above the gate oxide layer.

At 410, a spacer is selectively formed on the semiconductor body at a position that is above the gate material. In some embodiments, the spacer comprises a silicon nitride (SiN) spacer.

At 412, the gate material is etched to remove gate material that is not masked by the spacer.

At 414, a local isolation dielectric material is deposited on the semiconductor body to fill the plurality of trenches.

At 416, a channel implantation is performed. In some embodiments, the semiconductor body is selectively masked by a second masking layer and then implanted with a channel implantation. In some embodiments, the second masking layer comprises a patterned photoresist layer, while in other embodiments the second masking layer comprises the local isolation dielectric material.

At 418, a drain implantation is performed. In some embodiments, the semiconductor body is selectively masked by a third masking layer and then implanted with a drain implantation. In some embodiments, the third masking layer comprises a patterned photoresist layer, while in other embodiments the third masking layer comprises the local isolation dielectric material.

At 420, a data storage element is connected to the drain region by way of one or more back-end-of-the-line metal contacts and/or metallization layers. In some embodiments, the metal contact is formed within a dielectric layer formed above the semiconductor body. The dielectric layer is etched to form a hole that is subsequently filled with a metal to form the metal contact. In some embodiments, the metal contact may comprise tungsten. A data storage element is formed at a position that electrically contacts the metal contact.

At 422, the data storage element is connected to a bitline configured to provide a bias voltage to the data storage element. In some embodiments, the bitline comprises a metallization layer formed within a dielectric layer at a position within a back end metallization stack that is above the data storage element.

FIG. 5 illustrates a top view of a memory array 500 having one or more disclosed selection transistors. The top view illustrates the semiconductor body as having a first section 502 that comprises a doped semiconductor material and a second section 504 that comprises a shallow trench isolation formed above the doped semiconductor material.

FIGS. 6A-14 illustrate cross-sectional views of some embodiments of an exemplary semiconductor body, whereon such a methodology 400 is implemented. The cross-sectional views illustrate cross sections along a first line 506 that passes through the first section 502 of the semiconductor body that has the doped semiconductor material, and along a second line 508 that passes through the second section 504 of the semiconductor body that has a shallow trench isolation above the doped semiconductor material.

FIGS. 6A-6B illustrate cross-sectional views 600 and 602 of some embodiments of a semiconductor body corresponding to the semiconductor body of act 402. Cross-sectional view 600 illustrates a section of the semiconductor body comprising a semiconductor body 303 having a non-epitaxial, n-type silicon substrate. Cross-sectional view 602 illustrates a section of the semiconductor body 303 having a dielectric material 338 formed above a non-epitaxial, n-type silicon substrate. In some embodiments, the dielectric material 338 may comprise a shallow trench isolation.

Figures 7A, 7B:
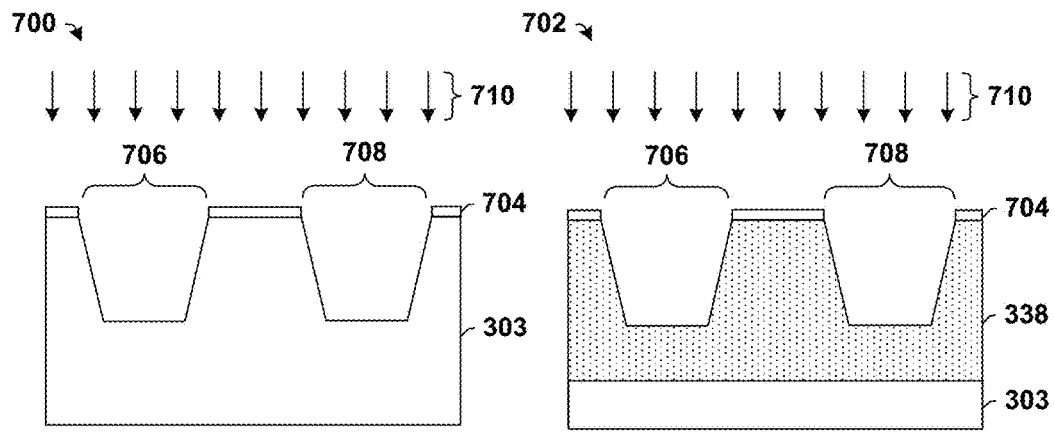

FIGS. 7A-7B illustrate cross-sectional views 700 and 702 of some embodiments of an etching process of the semiconductor body, which corresponds to act 404. As shown in cross-sectional view 700 (along the first section 502 of the semiconductor body), the top surface of the semiconductor body 303 is selectively masked with a first masking layer 704 having openings 706 and 708, before being exposed to an etchant 710. The etchant 710 removes the semiconductor body 303 at the location of the openings 706 and 708. As shown in cross-sectional view 702 (along the second section 504 of the semiconductor body), the top surface of the dielectric material 338 is selectively masked with the first masking layer 704 having openings 706 and 708, before being exposed to the etchant 710. The etchant 710 removes the dielectric material 338 at the openings 706 and 708.

In some embodiments, the first masking layer 704 comprises a patterned photoresist layer. The patterned photoresist layer may be formed on the top surface of the semiconductor body by spin coating photoresist onto the semiconductor body. The spin coated photoresist is then patterned by selective exposure to a light source (e.g., UV light) and subsequently developed. In other embodiments, the first masking layer 704 comprises a hard mask. In some embodiments, the etchant 710 comprises a wet etchant such as potassium hydroxide (KOH) or Tetramethylammonium hydroxide (TMAH). Selectively etching the semiconductor body with KOH results in trenches having a tapered side with an angle of 54.7° with the bottom surface of the trench (i.e., 35.3° from the normal). In other embodiments, the etchant 710 comprises a dry etchant (e.g., an RIE etchant). After etching is completed, the first masking layer 704 is removed.

Figures 8A, 8B:
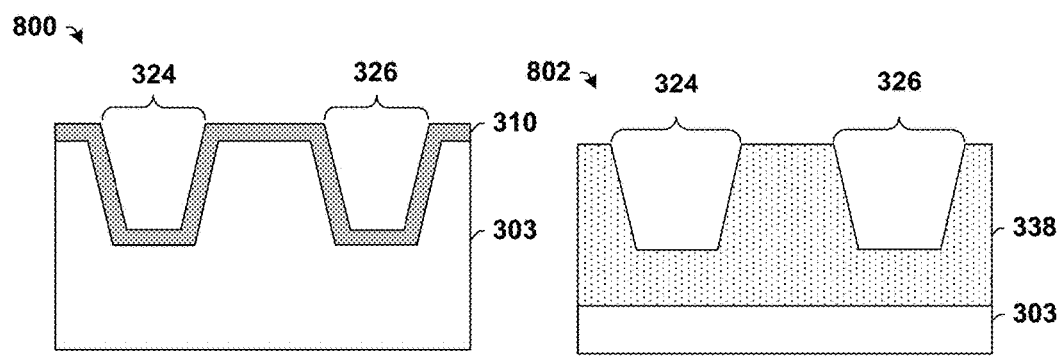

FIGS. 8A-8B illustrate some embodiments of cross-sectional views 802 and 804 showing the formation of a gate oxide layer 310 on the semiconductor body, which corresponds to act 406. As shown in cross-sectional view 800, the gate oxide layer 310 is formed to be conformal to semiconductor body, so that the gate oxide layer 310 is formed on the bottom and sidewalls of trenches 324 and 326. In some embodiments, the gate oxide layer 310 may be formed by a thermal oxide growth process. In other embodiments, the gate oxide layer 310 may be formed using a physical vapor deposition or a chemical vapor deposition technique (e.g., low pressure CVD, plasma enhanced CVD, etc.). The chemical vapor deposition provides for a multi-directional deposition that results in a conformal deposition on the top and side surfaces of the trenches and substrate. In some embodiments, the gate oxide layer 310 comprises silicon dioxide ($SiO_2$).

Figures 9A, 9B:
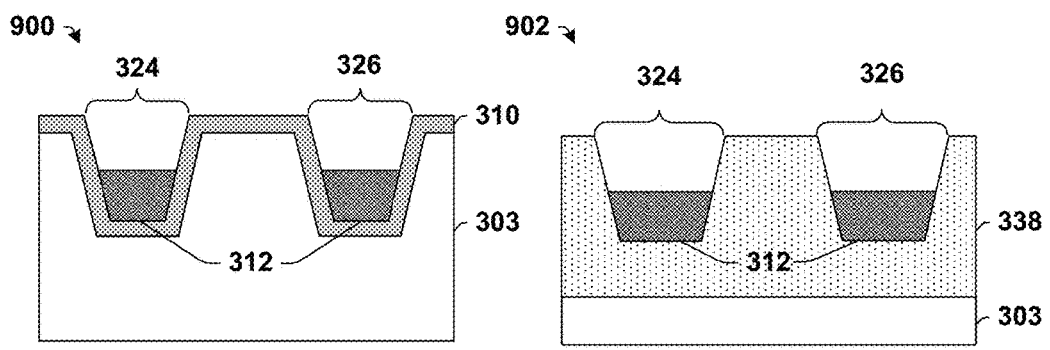

FIGS. 9A-9B illustrate some embodiments of cross-sectional views 900 and 902 showing the deposition of a gate material 312 on the semiconductor body, which corresponds to act 408. As shown in cross-sectional views 900, along a first section of the semiconductor body the gate material 312 is deposited at a position that is above the gate oxide layer 310. As shown in cross-sectional views 900, along a second section of the semiconductor body the gate material 312 is also above the dielectric material 338. The gate material 312 fills the bottom of the trenches, 324 and 326, so that the gate material 312 extends across a width of the trenches.

In some embodiments, the gate material 312 may be deposited using a physical vapor deposition technique (e.g., sputtering) or a chemical vapor deposition technique. Physical vapor deposition provides for a highly directional deposition that results in a non-conformal deposition that is predominately on the bottom of the trenches, 324 and 326, but not on the sidewalls of the trenches, 324 and 326. In various embodiments, the gate material 312 may comprise a metal material (e.g., TiN) or a doped polysilicon material. In some embodiments, chemical mechanical polishing is performed after deposition of the gate material 312 to remove excess gate material 312 from areas of the semiconductor body outside of the trenches, 324 and 326.

Figures 10A, 10B:
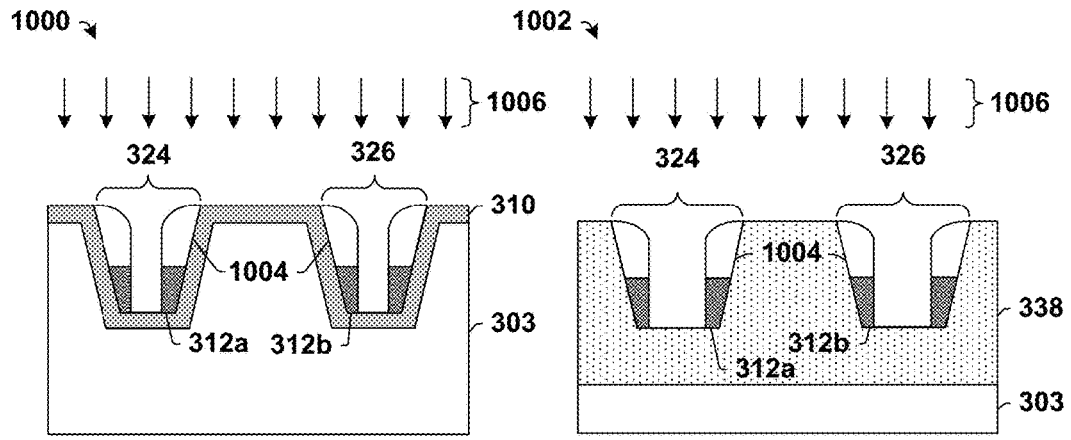

FIGS. 10A-10B illustrate cross-sectional views 1000 and 1002 of some embodiments of an etching process of the gate material 312, which corresponds to acts 410-412. As shown in cross sections 1000 and 1002, in the first and second sections of the semiconductor body, a spacer 1004 is formed within the trenches, 324 and 326, at a position above the gate material 312. In some embodiments, the spacer 1004 comprises a silicon nitride (SiN) material. The semiconductor body is subsequently exposed to an etchant 1006, which removes the gate material 312 within a trench (e.g., 324) at an opening in the spacer 1004, resulting in two separate gate electrodes 312a and 312b within a trench. In some embodiments, the etchant 1006 comprises a wet etchant comprising a nitric acid and/or a hydrofluoric acid. In other embodiments, the etchant 1006 comprises a dry etchant such as a RIE etching plasma etching or ion beam etching using $Cl_2$.

Figures 11A, 11B:
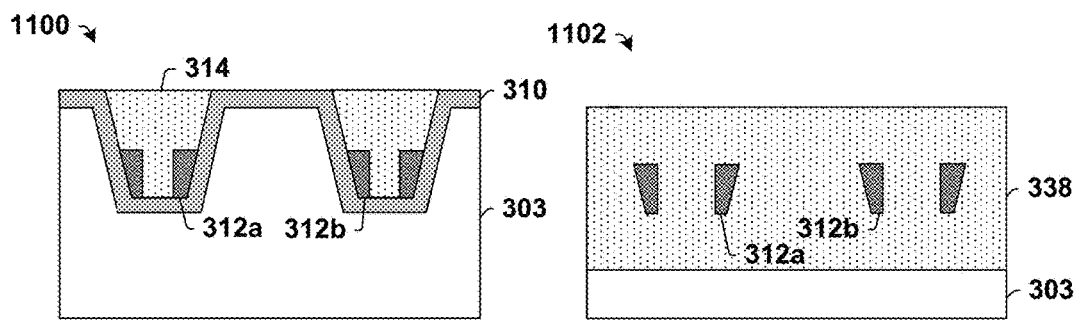

FIGS. 11A-11B illustrate cross-sectional views 1100 and 1102 of some embodiments of the deposition a local isolation dielectric material 314 (e.g., oxide), which corresponds to act 414. As shown in cross sections 1100 and 1102, the local isolation dielectric material 314 is deposited to a depth that fills the trenches, 324 and 326. In some embodiments, chemical mechanical polishing is performed after deposition of the local isolation dielectric material 314 to remove excess local isolation dielectric material from areas of the semiconductor body that are outside of the trenches. The local isolation dielectric material 314 may be deposited using a physical vapor deposition technique or a chemical vapor deposition technique, in various embodiments.

Figures 12A, 12B:
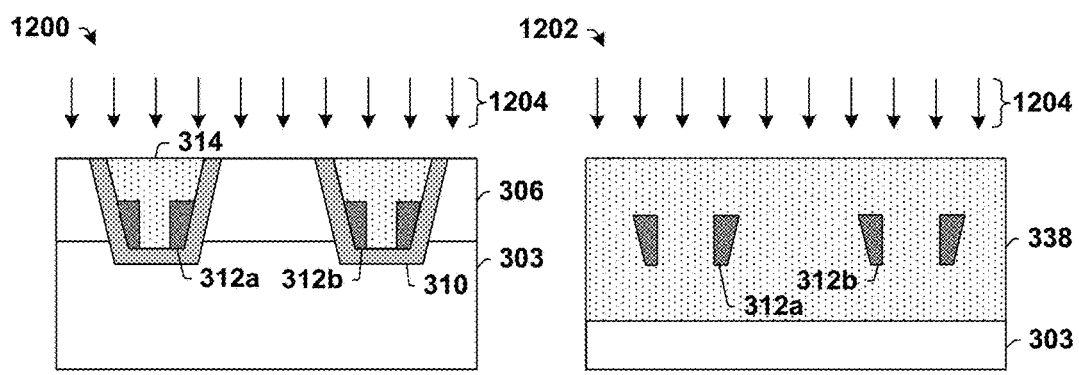

FIG. 12A-12B illustrate cross-sectional views 1200 and 1202 of some embodiments of a channel implantation 1204 of the semiconductor body 303, which corresponds to act 416. The channel implantation 1204 provides an implant dose having a second doping type, into one or more regions of the semiconductor body having a first doping type. The channel implantation 1204 may comprise the implantation of a p-type dopant (e.g., boron, gallium, etc.) or an n-type dopant (e.g., phosphorus, arsenic, etc.) into the semiconductor body. In some embodiments, the channel implantation is driven into the semiconductor body by diffusing the implanted dopants to a desired depth within the semiconductor body. In some embodiments, the channel implantation is driven into the semiconductor body by exposing the semiconductor body to an elevated temperature. The channel implantation can be driven into the semiconductor body to a various depths depending on the temperature and time of the drive in.

FIGS. 13A-13B illustrate cross-sectional views 1300 and 1302 of some embodiments of a drain implantation 1304 of the semiconductor body 303, which corresponds to act 418. The drain implantation 1304 provides an implant dose having a first doping type, into one or more regions of the semiconductor body having a first doping type. The drain implantation 1304 may comprise the implantation of a p-type dopant (e.g., boron, gallium, etc.) or an n-type dopant (e.g., phosphorus, arsenic, etc.) into the semiconductor body.

FIG. 14 illustrates a cross-sectional view 1400 showing some embodiments of the formation of back-end-of-the-line components, which corresponds to acts 420 and 422. In some embodiments, a first metal contact 316 is formed within an inter-level dielectric (ILD) layer 317 located on the top surface of the semiconductor body 303. In some embodiment, the first metal contact 316 comprises a titanium (Ti) or titanium nitride (TiN) plug. A data storage element 318 is formed above the first metal contact 316. A second metal contact 320 is formed within the ILD layer 317 above the data storage element 318. In some embodiments, the first and second metal contacts, 316 and 320, may be formed in separate ILD layers. A bitline 322 is formed within the ILD layer above the data storage element 318. In some embodiments, the bitline 322 may be formed in a separated ILD layer than the first and second metal contacts, 316 and 320.

Figure 15A:
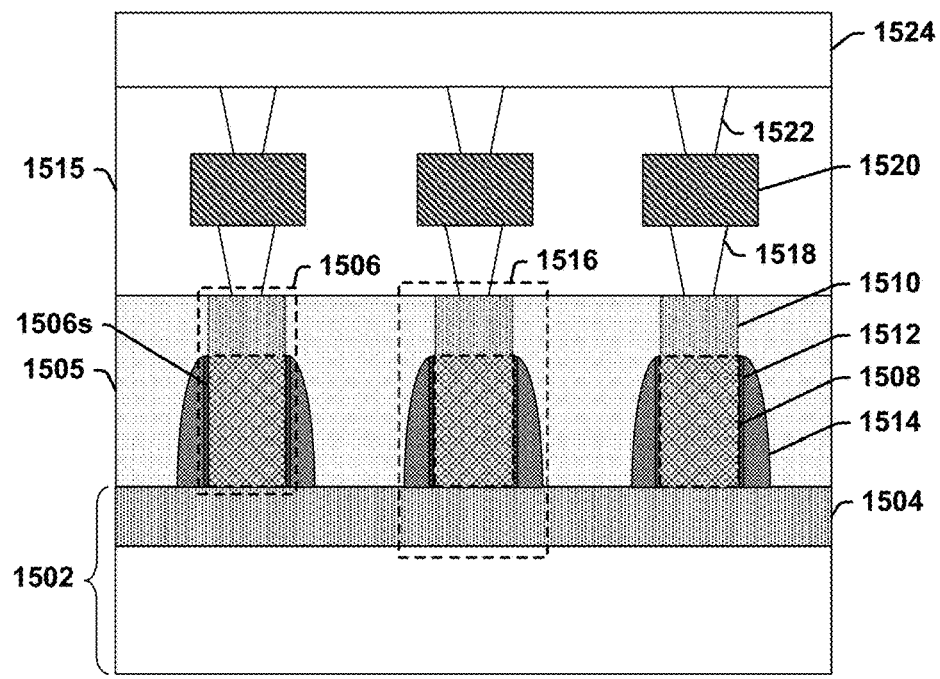
FIG. 15A illustrates a cross-sectional view of some embodiments of memory array comprising memory cells having vertical gate-all-around (GAA) selection transistors.

FIG. 15A illustrates a cross-sectional view of some embodiments of memory array 1500 comprising memory cells having vertical gate-all-around (GAA) selection transistors 1516.

The memory array 1500 comprises a plurality of vertical gate-all-around (GAA) selection transistors 1516 configured to provide access to a corresponding data storage element 1520. The vertical gate-all-around (GAA) selection transistors 1516 comprise one or more source regions 1504 disposed within a semiconductor body 1502 (i.e., semiconductor substrate). In some embodiments, the source regions 1504 may comprise one or more highly doped well regions within the semiconductor body 1502 that have a first doping type (e.g., an n-type doping or a p-type doping with a doping concentration of greater than approximately $10^{17}$ atoms/cm$^3$). In some embodiments, the source regions 1504 of adjacent vertical GAA selection transistors 1516 may comprise a same well region that forms a shared source line extending along a top surface of the semiconductor body 1502.

One or more semiconductor pillars 1506 are disposed over the source regions 1504 within an electrically isolating material 1505. In some embodiments, the one or more semiconductor pillars 1506 may comprise a same semiconductor material as the semiconductor body 1502. The one or more semiconductor pillars 1506 have a bottom surface abutting a top surface of the source regions 1504. The one or more semiconductor pillars 1506 comprise channel regions 1508 of the vertical GAA selection transistors 1516, and drain regions 1510 respectively disposed over the channel regions 1508. In some embodiments, the channel regions 1508 may have a second doping type that is different than the first doping type (e.g., a p-type doping or an n-type doping) of the source regions 1504, while the drain regions 1510 have the first doping type. In other embodiments, the channel regions 1508 may comprise a non-doped material, while the drain regions 1510 have the first doping type.

A gate dielectric layer 1512 is disposed on sidewalls 1506s of the one or more semiconductor pillars 1506 at a position separating the one or more semiconductor pillars 1506 from a gate region 1514 surrounding the one or more semiconductor pillars 1506. The gate region 1514 comprises a conductive material (e.g., metal or polysilicon) vertically disposed between the source regions 1504 and the drain regions 1510. Since the gate region 1514 extends vertically along the one or more semiconductor pillars 1506, the surface area consumed by the vertical GAA selection transistors 1516 is reduced in comparison to a conventional planar MOSFET selection transistor.

A first metal contact 1518 (i.e., via), disposed within an inter-level dielectric (ILD) layer 1515, is configured to electrically couple the drain regions 1510 of the vertical GAA selection transistors 1516 to data storage element 1520 configured to store data. In some embodiments, the data storage elements 1520 may comprises an RRAM (resistive random access memory) element. In such embodiments, the data storage elements 1520 comprise a dielectric structure having a resistance that can be reversibly changed by application of an appropriate voltage across the dielectric structure. In other embodiments, the data storage elements 1520 comprise a MRAM (magnetic random access memory) element. In such embodiments, the data storage elements 1520 comprise a stacked structure having a pinned (i.e., permanent) magnetic layer and a free magnetic layer separated by an insulating storage layer. A second metal contact 1522 is configured to further connect the data storage element 1520 to a metal layer comprising a bitline 1524.

During operation of the vertical GAA selection transistors 1516, a voltage may be selectively applied to the gate region 1514. The applied bias voltage causes the gate region 1514 to control the flow of charge carriers in a vertical direction between the source regions 1504 and the drain regions 1510. For example, in some embodiments, a control circuit (not shown) may be configured to apply a first bias voltage $V_{bias1}$ to the data storage element 1520 by way of bitline 1524 and a second bias voltage $V_{bias2}$ to the data storage element 1520 by way of the source regions 1504.

Figure 15B:
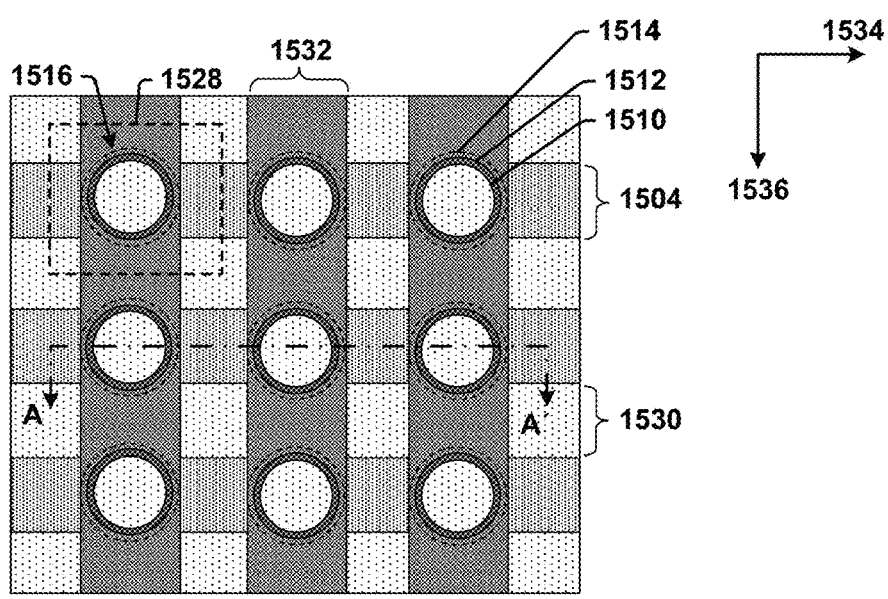
FIG. 15B illustrates a top-view of some embodiments of memory array comprising a plurality of memory cells, respectively comprising a vertical GAA selection transistor.

FIG. 15B illustrates a top-view 1526 of some embodiments of memory array 1500 comprising a plurality of memory cells 1528, respectively comprising a vertical GAA selection transistor 1516.

As shown in top-view 1526, the memory array 1500 comprises alternating rows extending along a first direction 1534, which comprise source regions 1504 (e.g., well regions) and an electrically isolating material 1530. The electrically isolating material 1530 is configured to provide electrical isolation between adjacent ones of the source regions 1504 in a second direction 1536, perpendicular to the first direction 1534, so as to separate the well regions into electrically isolated shared source lines extending between a first group of the one or more semiconductor pillars 1506 aligned in the first direction 1534. In some embodiments, the source regions 1504 may be disposed as a well region within a top surface of the semiconductor body 1502, while the electrically isolating material 1530 may comprise a dielectric material disposed over the semiconductor body 1502. Electrically isolating the shared source lines using the electrically isolating material 1530 lowers the RC delay of the source lines during switching.

Top-view 1526 further shows that the gate region extends as a continuous columns/layer of gate material 1532 along the second direction 1536. The columns of gate material 1532 surround the semiconductor pillars 1506 so as to form a gate-all-around structure. By extending between a second group of the one or more semiconductor pillars 1506 aligned in the second direction 1536, the columns of gate material 1532 form word lines that are shared between memory cells 1528 of the memory array 1500. In some embodiments, a height of the columns of gate material 1532 may vary as a function of position between silicon pillars along the second direction. For example, a height of the gate material in gate regions surrounding the semiconductor pillars 1506 may be greater than a height of the columns of gate material 1532 in areas intersecting the rows of the electrically isolating material 1530.

Figure 16:
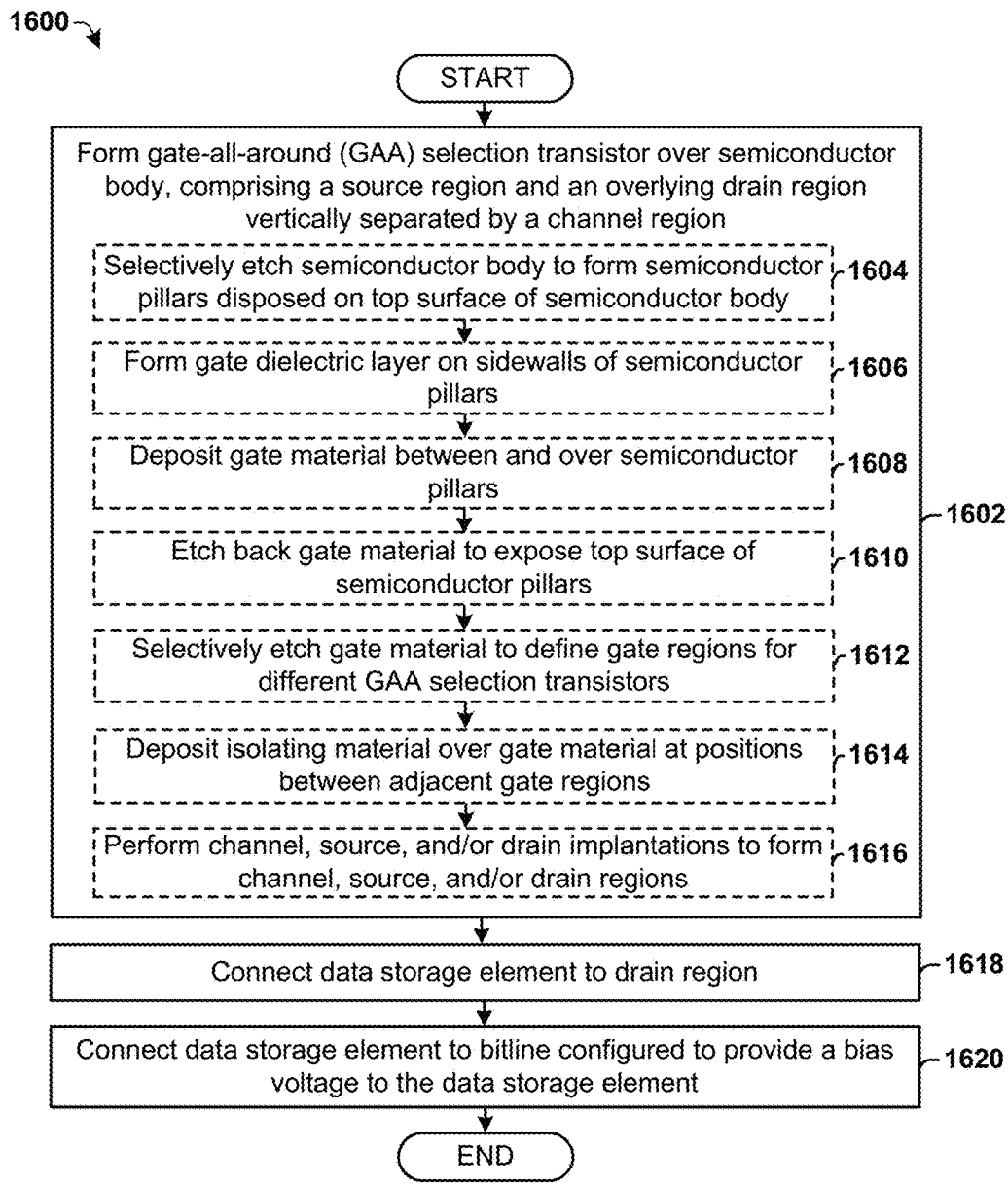
FIG. 16 is a flow diagram of an exemplary embodiment of a method of forming a memory array having memory cells with vertical GAA selection transistors.

FIG. 16 is a flow diagram of an exemplary embodiment of a method 1600 of forming a memory cell having a vertical gate-all-around (GAA) selection transistor.

At 1602, a gate-all-around (GAA) selection transistor is formed over a semiconductor body. The GAA selection transistor comprises a source region and an overlying drain region vertically separated by a channel region. In some embodiments, the GAA selection transistor may be formed according to acts 1604-1616, as described below.

At 1604, a semiconductor body is selectively etched to form a plurality of semiconductor pillars disposed along a top surface of the semiconductor body.

At 1606, a gate dielectric layer is formed on sidewalls of the plurality of semiconductor pillars.

At 1608, a gate material is deposited on the semiconductor body at a position located between and over adjacent semiconductor pillars.

At 1610, the gate material is etched back to expose a top surface of the plurality of semiconductor pillars.

At 1612, the gate material is selectively etched between adjacent semiconductor pillars to define gate regions for different GAA selection transistors.

At 1614, an electrically isolating material is deposited over the gate material at positions between adjacent gate regions.

At 1616, channel, source, and/or drain implantations are performed to form the channel region, the source region and/or the drain region, respectively.

At 1618, a data storage element is connected to the drain region by way of one or more back-end-of-the-line metal contacts and/or metallization layers.

At 1620, the data storage element is connected to a bitline configured to provide a bias voltage to the data storage element. In some embodiments, the bitline comprises a metallization layer formed within a dielectric layer at a position within a back end metallization stack that is above the data storage element.

FIGS. 17A-23C illustrate some embodiments of an exemplary semiconductor body, upon which a method 1600 of forming a memory array having memory cells with vertical gate-all-around (GAA) selection transistors. Although FIGS. 17A-23C are described in relation to method 1600, it will be appreciated that the structures disclosed in FIGS. 17A-23C are not limited to such a method, but instead may stand alone as structures independent of the method.

Figures 17A, 17B:
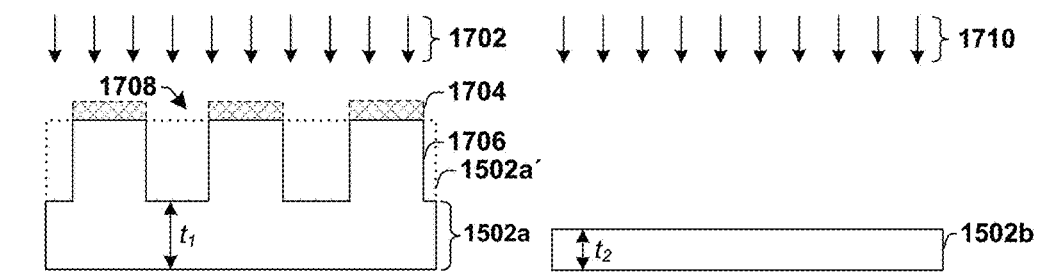
FIGS. 17A-23C illustrate some embodiments of an exemplary semiconductor body, upon which a method of forming a memory array having memory cells with vertical GAA selection transistors.
Figure 17C:
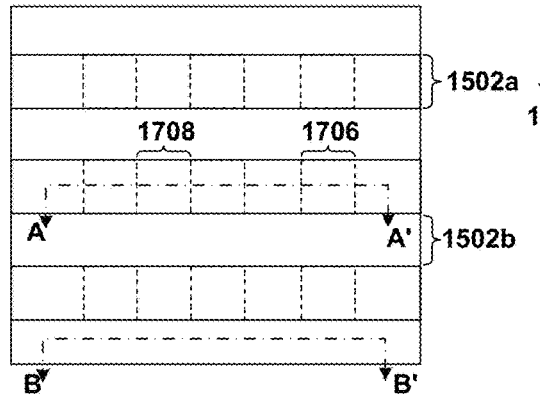

FIGS. 17A-17B illustrate some embodiments of cross-sectional views, 1700A and 1700B, corresponding to act 1604. Cross-sectional view 1700A illustrates a cross section along a first line A-A', shown in top-view 1712 of FIG. 17C, passing through a first section of the semiconductor body 1502a. Cross-sectional view 1700B illustrates a cross section along a second line B-B', shown in top-view 1712 of FIG. 17C, passing through a second section of the semiconductor body 1502b.

As shown in cross-sectional view 1700A, the semiconductor body 1502a' is selectively etched to form one or more semiconductor pillars 1706. The one or more semiconductor pillars 1706 protrude from the semiconductor body 1502a and are separated by recesses 1708 disposed between adjacent ones of the one or more semiconductor pillars 1706. In some embodiments, the semiconductor body 1502a' may be selectively etched by forming a first masking layer 1704 (e.g., silicon oxide, silicon nitride, photoresist, etc.) over areas of the semiconductor body 1502a' corresponding to the one or more semiconductor pillars 1706. After formation of the first masking layer 1704, the semiconductor body 1502a' may be exposed to a first etchant 1702 configured to selectively etch the semiconductor body 1502a' in areas not covered by the first masking layer 1704. In some embodiments, the first etchant 1702 may comprise a wet etchant (e.g., having diluted hydrochloric acid (HCl)) or a dry etchant (e.g., having an etching chemistry comprising one or more of fluorine (F), Tetrafluoromethane ($CF_4$), ozone ($O_2$), or $C_4F_8$ (Octafluorocyclobutane)).

As shown in cross-sectional view 1700A, the semiconductor body 1500a has a first thickness $t_1$ along the first cross-sectional line A-A'. As shown in cross-sectional view 1700B, the semiconductor body may be etched by a separate etchant 1710 to form recessed regions of the semiconductor body 1502b having a second thickness $t_2$, which is smaller than the first thickness $t_1$, along the second cross-sectional line B-B'. The different thicknesses cause the one or more semiconductor pillars 1706 to be disposed at a position that is vertically overlying the recessed regions of the semiconductor body 1502b.

In various embodiments, the semiconductor body 1502 may comprise any type of semiconductor body such as a semiconductor wafer or one or more die on a wafer, as well as any other type of semiconductor and/or epitaxial layers formed thereon and/or otherwise associated therewith. In some embodiments, the semiconductor body 1502 may comprise a semiconductor material such as silicon (Si), silicon germanium (SiGe), germanium (Ge), indium arsenide (InAs), Gallium arsenide (GaAs), etc.

Figures 18A, 18B:
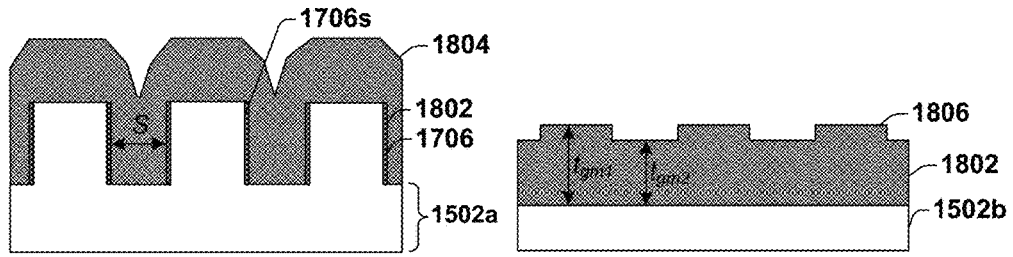

FIGS. 18A-18B illustrate some embodiments of cross-sectional views, 1800A and 1800B, corresponding to acts 1604-1606.

As shown in cross-sectional view 1800A, a gate dielectric layer 1802 is formed conformal to the sidewalls 1706s of the one or more semiconductor pillars 1706. A gate material 1804 is subsequently formed at a position separated from the sidewalls 1706s of the one or more semiconductor pillars 1706 by the gate dielectric layer 1802. In some embodiments, the gate dielectric layer 1802 may comprise a high-k gate dielectric material (e.g., such as hafnium oxide (HfOx), zirconium oxide (ZrOx), Aluminum oxide ($Al_2O_3$), etc.). In some embodiments, the gate dielectric layer 1802 and the gate material 1804 may be formed by way of a vapor deposition technique (e.g., CVD, PVD, etc.) or by way of atomic layer deposition (ALD). In some embodiments, the gate material 1804 may comprises a gate metal layer (e.g., W, Al, etc.). In some embodiments, the gate material 1804 may be deposited to a thickness that is greater than ½ a space S between adjacent ones of the one or more semiconductor pillars 1706. In other embodiments, the gate dielectric layer 1802 may comprise an oxide formed by a thermal oxide growth process.

As shown in cross-sectional view 1800B, the gate material 1804 is also formed over the recessed regions of the semiconductor body 1502b. In the recessed regions of the semiconductor body 1502b, the gate material 1804 comprises a non-planar top surface having protrusions 1806 that extend outward from a top surface of the gate material 1804 at locations disposed between semiconductor pillars 1706 in the second direction 1536 (shown in FIG. 17C). For example, within the recessed region of the semiconductor body 1502b the gate material 1804 may have a first thickness $t_{gm1}$ at locations between semiconductor pillars 1706 aligned in the second direction 1536, and a second thickness $t_{gm2}$ that is less than the first thickness $t_{gm1}$ at locations not between semiconductor pillars 1706 aligned in the second direction 1536.

Figures 19A, 19B:
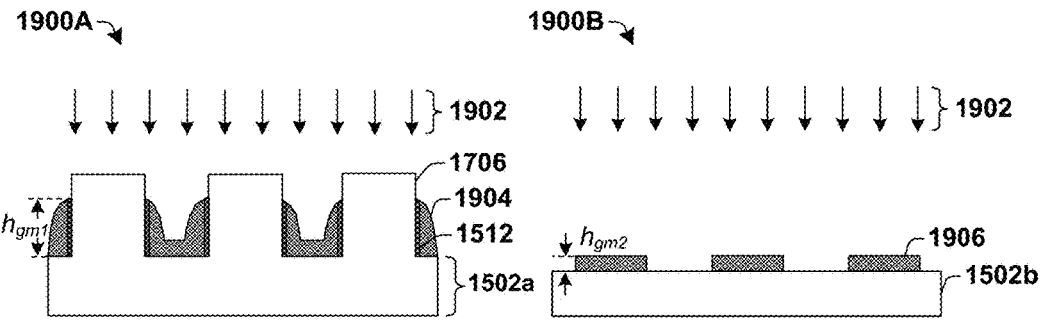

FIGS. 19A-19B illustrate some embodiments of cross-sectional views, 1900A and 1900B, corresponding to act 1608.

As shown in cross-sectional view 1900A, the gate dielectric layer 1802 and the gate material 1804 are exposed to a second etchant 1902 configured to etch back the gate dielectric layer 1802 and the gate material 1804 from over one or more semiconductor pillars 1706. Etching back the gate dielectric layer 1802 and the gate material 1804 exposes a top surface of one or more semiconductor pillars 1706. In some embodiments, the second etchant 1902 comprises a wet etchant comprising a nitric acid and/or a hydrofluoric acid. In other embodiments, the second etchant 1902 comprises a dry etchant such as a RIE etching plasma etching or ion beam etching using chlorine ($Cl_2$).

As shown in cross-sectional view 1900B, in the recessed region of the semiconductor body 1502b, the gate material 1906 remains in areas between one or more semiconductor pillars 1706 aligned in the second direction 1536. The remaining gate material causes the gate region to extend continuously between the semiconductor pillars 1706. The continuous extension of the gate region forms a word line comprising a continuous line of gate material running between semiconductor pillars 1706 aligned in the second direction 1536 (i.e., into the paper). A height of the gate material varies as a function of position between one or more semiconductor pillars 1706 along the second direction 1536. For example, the gate material may have a first height $h_{gm1}$ in areas of the gate material intersecting rows of the source regions 1504 and a second height $h_{gm2}$, which is smaller than the first height $h_{gm1}$, in areas of the gate material intersecting rows of the electrically isolating material 1530.

Figures 20A, 20B:
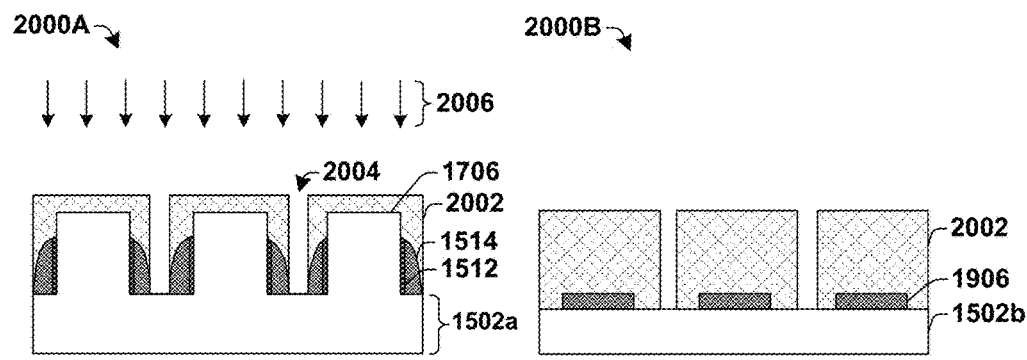

FIGS. 20A-20B illustrate some embodiments of cross-sectional views, 2000A and 2000B, corresponding to act 1610.

As shown in cross-sectional view 2000A, a second masking layer 2002 (e.g., silicon oxide, silicon nitride, photoresist, etc.) is formed over the gate layer 1904. The second masking layer 2002 has openings 2004 that expose the gate layer 1904 at positions between the semiconductor pillars 1706. After formation of the second masking layer 2002, the gate layer 1904 may be exposed to a third etchant 2006 configured to selectively etch the gate layer 1904 in areas not covered by the second masking layer 2002 to define gate regions 1514 for different GAA transistor devices. In some embodiments, the third etchant 2006 comprises a wet etchant comprising a nitric acid and/or a hydrofluoric acid. In other embodiments, the third etchant 2006 comprises a dry etchant such as a RIE etching plasma etching or ion beam etching using chlorine ($Cl_2$). As shown in cross-sectional view 2000B, the third etchant 2006 does not affect gate material 1906 in the recessed regions of the semiconductor body 1502b.

Figures 21A, 21B:
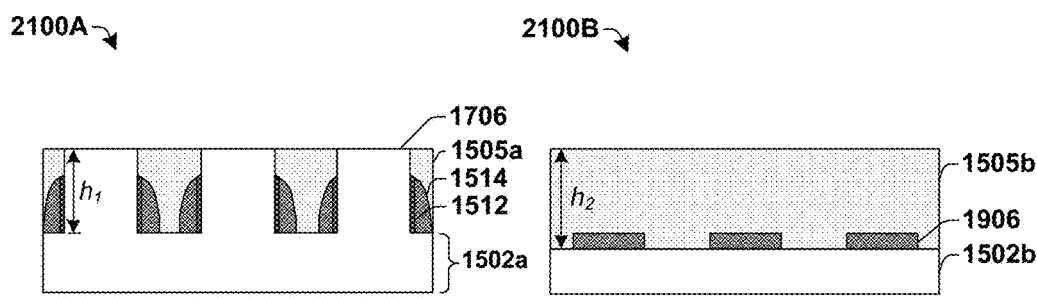

FIGS. 21A-21B illustrate some embodiments of a cross-sectional views, 2100A and 2100B, corresponding to act 1612.

As shown in cross-sectional view 2100A, an electrically isolating material 1505 is formed between adjacent gate regions 1514. In some embodiments, the electrically isolating 1505 is deposited to a depth that fills trenches between the one or more semiconductor pillars 1706. In some embodiments, a chemical mechanical polishing (CMP) process is performed after deposition of the electrically isolating material 1505 to remove excess electrically isolating material 1505 from areas overlying the one or more semiconductor pillars 1706. In various embodiments, the electrically isolating material 1505 may be deposited using a physical vapor deposition technique or a chemical vapor deposition technique. In some embodiments, the electrically isolating material 1505 may comprise one or more of silicon-dioxide ($SiO_2$), silicon nitride (SiN), silicon carbon-nitride (SiCN), silicon carbon oxy-nitride (SiCON), etc.

As shown in cross-sectional view 2100B, the electrically isolating material 1505b is also formed over the recessed region of the semiconductor body 1500b. The electrically isolating material 1505b formed over the recessed region of the semiconductor body 1500b has a second height $h_2$ that is larger than a first height $h_1$ of the one or more semiconductor pillars 1706. The difference in height is due to the one or more semiconductor pillars 1706 being disposed at a position that is vertically overlying the recessed regions of the semiconductor body 1502b.

Figures 22A, 22B:
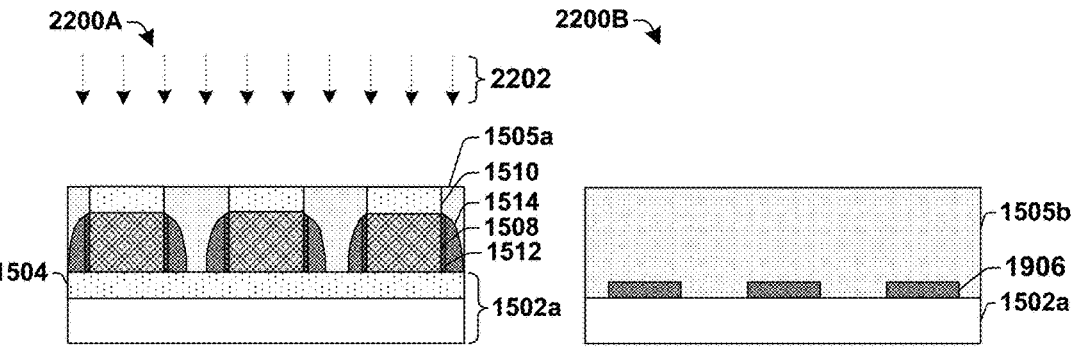

FIGS. 22A-22B illustrate some embodiments of cross-sectional views, 2200A and 2200B, corresponding to act 1614.

As shown in cross-sectional view 2200A, one or more implantations 2202 are performed to form a source region within the semiconductor body 1502a, and a channel region, and a drain region within the semiconductor pillars 1706. In some embodiments, the one or more implantations may comprise one or more of a source implantation, a channel implantation, and a drain implantation.

The source implantation is performed to form one or more source regions 1504 within semiconductor body 1502a. The source implantation provides an implant dose having a first doping type, into one or more regions of the semiconductor body 1500a underlying the semiconductor pillars. In various embodiments, the source implantation may comprise the implantation of a p-type dopant (e.g., boron, gallium, etc.) or an n-type dopant (e.g., phosphorus, arsenic, etc.) into the semiconductor body 1502a. In some embodiments, the source implantation is driven into the semiconductor body 1502a by diffusing the implanted dopants to a desired depth within the semiconductor body 1502a. In some embodiments, the source implantation is driven into the semiconductor body 1502a by exposing the semiconductor body 1502a to an elevated temperature.

In some embodiments, a channel implantation may be subsequently performed to form one or more channel regions 1508 within the one or more semiconductor pillars 1706. The channel implantation selectively provides an implant dose having a second doping type, into the one or more semiconductor pillars 1706.

A drain implantation may be subsequently performed to form one or more drain regions 1510 within the one or more semiconductor pillars 1706 at positions overlying the one or more channel regions 1508. The drain implantation selectively provides an implant dose having a first doping type, into a top portion of the semiconductor pillars.

Figures 23A, 23B:
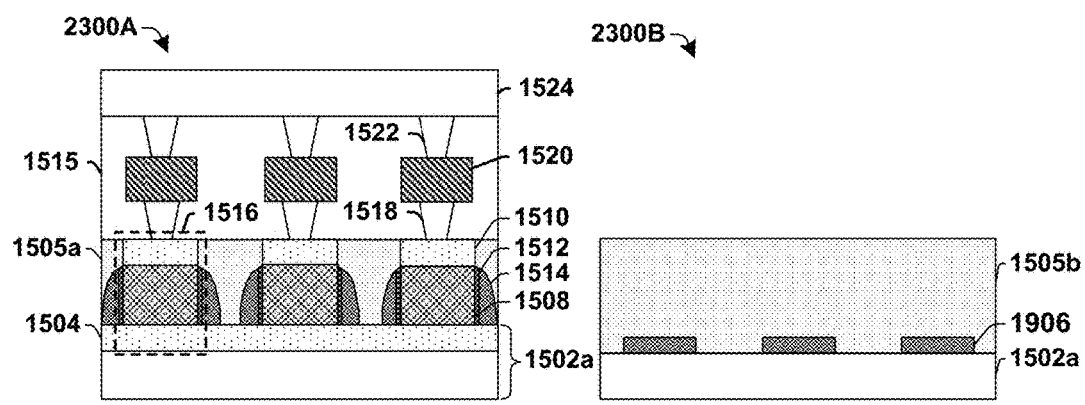
Figure 23C:
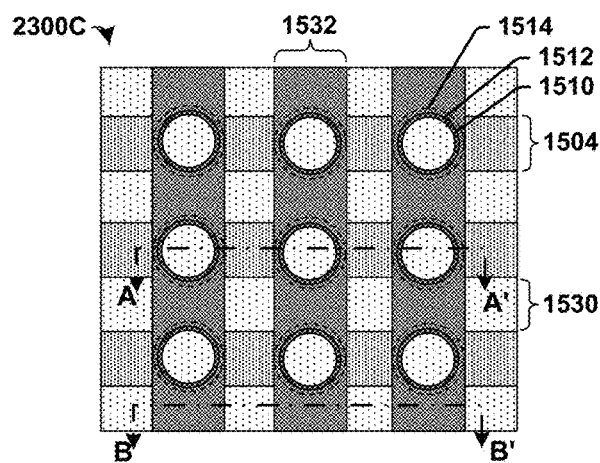

FIGS. 23A-23B illustrate some embodiments of cross-sectional views, 2300A and 2300B, corresponding to act 1616-1618. FIG. 23C illustrates a top-view 2300C corresponding to cross-sectional views 2300A and 2300B.

As shown in cross-sectional view 2300A, a first metal contact 1518 is formed within an inter-level dielectric (ILD) layer 1515 located over the vertical GAA selection transistors 1516. In some embodiment, the first metal contact 1518 may comprise titanium (Ti), titanium nitride (TiN), or copper, for example. In some embodiments, the first metal contact 1518 is formed by etching the ILD layer 1515 to form a hole that is subsequently filled with a metal.

A data storage element 1520 is formed above the first metal contact 1518. A second metal contact 1522 is formed within the ILD layer 1515 above the data storage element 1520. In some embodiments, the first and second metal contacts, 1518 and 1522, may be formed in separate ILD layers. A bitline 1524 is formed above the data storage element 1520. In some embodiments, the bitline 1524 may be formed in a separated ILD layer than the first and second metal contacts, 1518 and 1522.

Therefore, the present disclosure relates to an integrated chip having a vertical transistor device.

In some embodiments, the present disclosure relates to an integrated chip. The integrated chip comprises a semiconductor body having a trench extending along first sides of a source region, a channel region over the source region, and a drain region over the channel region. A gate electrode is arranged along a first sidewall of the trench, and a metal contact is arranged on the drain region. An isolation dielectric material is disposed within the trench. The isolation dielectric material is vertically over a top surface of the gate electrode and is laterally adjacent to the gate electrode.

In other embodiments, the present disclosure relates to a transistor device. The transistor device comprises a substrate having a trench extending along sides of a first region having a first doping type, a second region arranged over the first region and having a second doping type different than the first doping type, and a third region arranged over the second region and having the first doping type. A gate electrode is arranged along a first sidewall of the trench. The gate electrode has a top surface that is below an upper surface of the substrate. A first metal contact is arranged on the third region.

In yet other embodiments, the present disclosure relates to an integrated chip. The integrated chip comprises a substrate having a trench extending along first sides of a source region, a channel region over the source region, and a drain region over the channel region. A gate dielectric layer is disposed along opposing sidewalls and a bottom surface of the trench. A first gate electrode and a second gate electrode are respectively arranged along the opposing sidewalls of the trench. A dielectric material is disposed within the trench at a location that separates the first gate electrode and the second gate electrode. The dielectric material has an upper surface that is substantially co-planar with an upper surface of the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a semiconductor body having a trench extending along first sides of a source region, a channel region over the source region, and a drain region over the channel region;
a gate electrode arranged along a first sidewall of the trench;
a metal contact arranged directly over the drain region;
an isolation dielectric material disposed within the trench, wherein the isolation dielectric material is vertically over a top surface of the gate electrode and laterally adjacent to the gate electrode; and
a dielectric structure laterally surrounding the metal contact, wherein the dielectric structure is directly over the isolation dielectric material.

2. The integrated chip of claim 1, wherein the top surface of the gate electrode is below an upper surface of the semiconductor body.

3. The integrated chip of claim 1, further comprising:
a gate dielectric layer arranged between the gate electrode and the first sidewall of the trench, wherein the gate dielectric layer has an upper surface that is above the top surface of the gate electrode and wherein the isolation dielectric material and the gate electrode have bottommost surfaces contacting a same upper surface of the gate dielectric layer.

4. The integrated chip of claim 3, wherein the gate electrode has a first sidewall abutting the gate dielectric layer and a second sidewall facing a center of the trench, wherein the first sidewall is oriented at a larger angle with respect to a line perpendicular to a bottom of the trench than the second sidewall.

5. The integrated chip of claim 3, wherein the upper surface of the gate dielectric layer is substantially co-planar with an upper surface of the isolation dielectric material.

6. The integrated chip of claim 3,
wherein the gate electrode is laterally between the isolation dielectric material and the drain region along a first cross-section extending in a first direction; and
wherein the gate electrode is laterally between the isolation dielectric material and a dielectric material along a second cross-section extending in the first direction and separated from the first cross-section along a second direction perpendicular to the first direction.

7. The integrated chip of claim 6,
wherein the gate electrode has a first lower surface along the first cross-section and a second lower surface along the second cross-section that is below the first lower surface.

8. The integrated chip of claim 1,
wherein the gate electrode has a bottommost surface facing the semiconductor body; and
wherein the top surface of the gate electrode is wider than the bottommost surface.

9. The integrated chip of claim 1, further comprising:
a second gate electrode arranged along a second sidewall of the trench, wherein the second gate electrode is separated from the gate electrode by the isolation dielectric material.

10. The integrated chip of claim 1, further comprising:
a third gate electrode arranged within a second trench in the semiconductor body, wherein the second trench extends along second sides of the source region, the channel region, and the drain region; and
a second isolation dielectric material disposed within the second trench, wherein the second isolation dielectric material is vertically over and laterally adjacent to the third gate electrode.

11. A transistor device, comprising:
a substrate having a trench extending along sides of a first region having a first doping type, a second region arranged over the first region and having a second doping type different than the first doping type, and a third region arranged over the second region and having the first doping type;
a gate electrode arranged along a first sidewall of the trench, wherein the gate electrode has a top surface that is below an upper surface of the substrate;
a first metal contact contacting the third region; and
a dielectric structure laterally surrounding the first metal contact, wherein the dielectric structure is directly over the third region.

12. The transistor device of claim 11, further comprising:
a gate dielectric layer arranged between the gate electrode and the first sidewall.

13. The transistor device of claim 12, wherein the gate dielectric layer has a bottom surface that is below a bottom surface of the gate electrode.

14. The transistor device of claim 12, further comprising:
a dielectric material disposed within the trench, wherein the dielectric material is vertically over and laterally adjacent to the gate electrode, wherein the dielectric material and the gate electrode have bottommost surfaces contacting a same upper surface of the gate dielectric layer.

15. The transistor device of claim 14, wherein the gate dielectric layer has an upper surface that is substantially co-planar with an upper surface of the dielectric material.

16. An integrated chip, comprising:
 a substrate having a trench extending along first sides of a source region, a channel region over the source region, and a drain region over the channel region;
 a gate dielectric layer disposed along opposing sidewalls and a bottom surface of the trench;
 a first gate electrode and a second gate electrode respectively arranged along the opposing sidewalls of the trench;
 a dielectric material disposed within the trench at a location that separates the first gate electrode and the second gate electrode; and
 wherein the dielectric material, the first gate electrode, and the second gate electrode have bottommost surfaces contacting a same upper surface of the gate dielectric layer.

17. The integrated chip of claim 16,
 wherein the first gate electrode has a first lower surface facing the substrate along a first cross-section and a second lower surface facing the substrate along a second cross-section; and
 wherein the second lower surface is below the first lower surface.

18. The integrated chip of claim 16, wherein the dielectric material disposed within the trench is vertically over top surfaces of the first gate electrode and the second gate electrode.

19. The integrated chip of claim 16, wherein the source region has a first doping type, the channel region has a second doping type different than the first doping type, and the drain region has the first doping type.

20. The integrated chip of claim 16, wherein the gate dielectric layer laterally and vertically separates the first gate electrode from the substrate.

* * * * *